(12) United States Patent  
Chang et al.

(10) Patent No.: US 9,926,190 B2
(45) Date of Patent: Mar. 27, 2018

(54) MEMS DEVICES AND METHODS OF FORMING THE SAME

(71) Applicant: Taiwan Semiconductor Manufacturing Company, Ltd., Hsin-Chu (TW)

(72) Inventors: Kai-Fung Chang, Taipei (TW); Len-Yi Leu, Hsin-Chu (TW); Lien-Yao Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/003,332

(22) Filed: Jan. 21, 2016

(65) Prior Publication Data

US 2017/0210618 A1    Jul. 27, 2017

(51) Int. Cl.
*B81C 1/00* (2006.01)
*B81B 3/00* (2006.01)
*H01L 23/48* (2006.01)
*G01L 9/00* (2006.01)
*H01L 21/768* (2006.01)

(52) U.S. Cl.
CPC ........ *B81C 1/00158* (2013.01); *B81B 3/0021* (2013.01); *B81B 2203/0127* (2013.01); *B81B 2207/09* (2013.01); *B81C 2203/0109* (2013.01); *B81C 2203/0172* (2013.01); *G01L 9/0042* (2013.01); *G01L 9/0073* (2013.01); *H01L 21/76898* (2013.01); *H01L 23/481* (2013.01); *H01L 2224/80805* (2013.01); *H01L 2224/81805* (2013.01)

(58) Field of Classification Search
CPC ... B81C 1/00357; B81C 1/00523; B81B 7/02; B81B 2201/0235; B81B 2201/00264
See application file for complete search history.

(56) References Cited

U.S. PATENT DOCUMENTS

| | | | |
|---|---|---|---|
| 5,310,450 A * | 5/1994 | Offenberg | G01P 15/0802 148/DIG. 159 |
| 8,802,473 B1 | 8/2014 | Chu et al. | |
| 9,040,334 B2 | 5/2015 | Cheng et al. | |
| 9,187,317 B2 | 11/2015 | Cheng et al. | |
| 2005/0172717 A1* | 8/2005 | Wu | B60C 23/0408 73/514.34 |
| 2008/0315333 A1* | 12/2008 | Combi | B81B 7/0061 257/415 |
| 2011/0126632 A1* | 6/2011 | McNeil | B81B 7/02 73/718 |

(Continued)

*Primary Examiner* — Lex Malsawma
*Assistant Examiner* — Gardner W Swan
(74) *Attorney, Agent, or Firm* — Slater Matsil, LLP

(57) ABSTRACT

A MEMS device and methods of forming are provided. A dielectric layer of a first substrate is patterned to expose conductive features and a bottom layer through the dielectric layer. A first surface of a second substrate is bonded to the dielectric layer and the second substrate is patterned to form a membrane and a movable element. A cap wafer is bonded to the second substrate, where bonding the cap wafer to the second substrate forms a first sealed cavity comprising the movable element and a second sealed cavity that is partially bounded by the membrane. Portions of the cap wafer are removed to expose the second sealed cavity to ambient pressure.

20 Claims, 26 Drawing Sheets

(56) References Cited

U.S. PATENT DOCUMENTS

| | | | |
|---|---|---|---|
| 2011/0159627 A1* | 6/2011 | Mantravadi | B81C 1/00182 438/52 |
| 2012/0043627 A1* | 2/2012 | Lin | B81B 7/02 257/415 |
| 2012/0260747 A1* | 10/2012 | Chen | G01L 19/0092 73/863 |
| 2013/0283912 A1* | 10/2013 | Lin | G01P 15/0802 73/514.16 |
| 2013/0340525 A1* | 12/2013 | Liu | G01P 15/0802 73/514.11 |
| 2014/0264653 A1 | 9/2014 | Cheng et al. | |
| 2016/0137491 A1* | 5/2016 | Su | B81B 7/02 257/418 |
| 2016/0341616 A1* | 11/2016 | Classen | G01L 9/0042 |

\* cited by examiner

MEMS DEVICES AND METHODS OF FORMING THE SAME

BACKGROUND

Micro-electromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating different MEMS devices into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1:
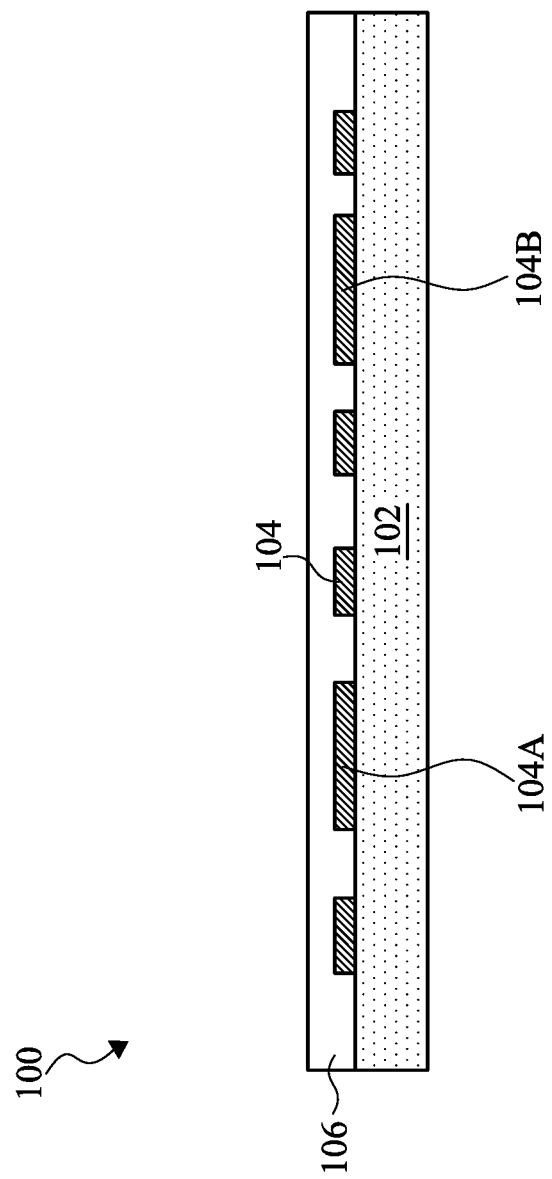
FIGS. 1 through 26 are cross-sectional views of intermediate stages of manufacture of a MEMS device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 25:
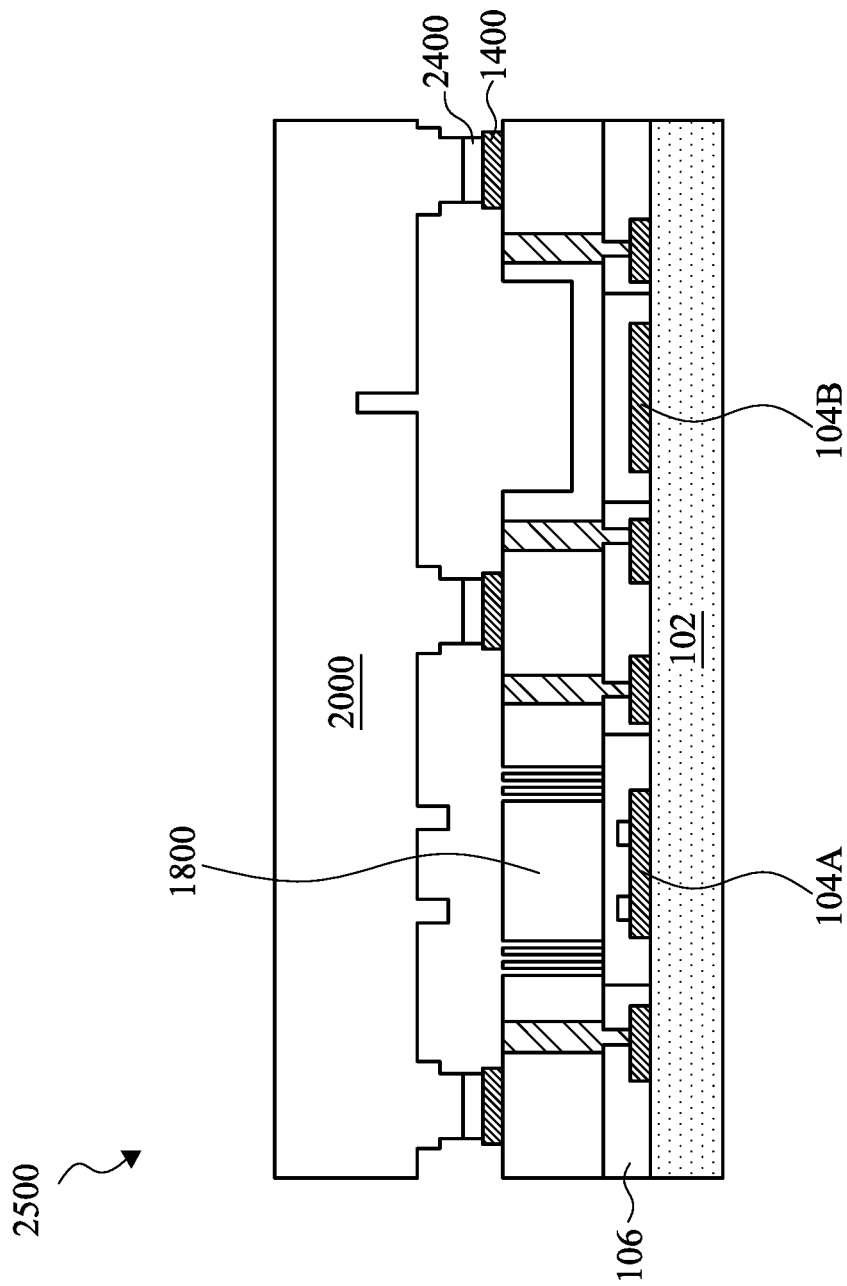
Figure 26:
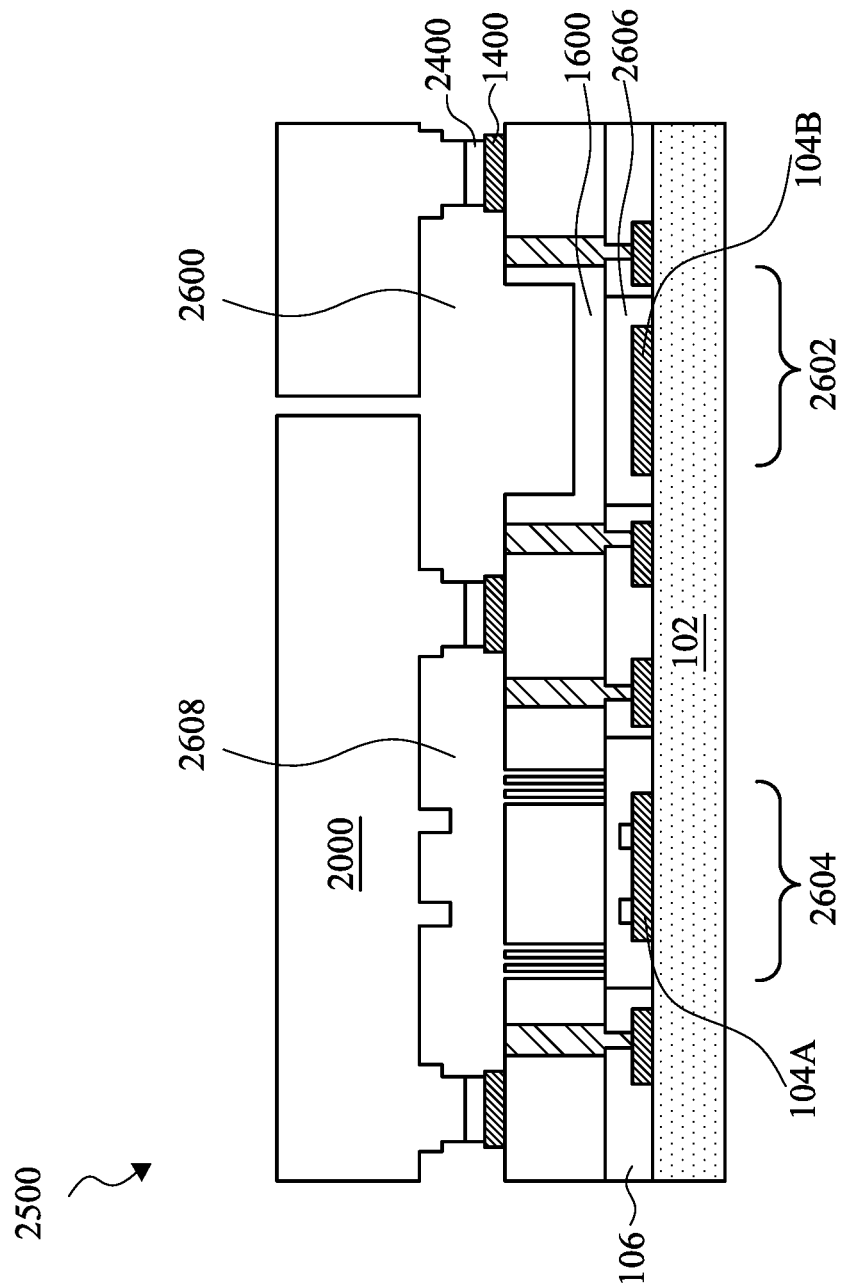

FIGS. 1 through 26 illustrate cross-sectional views of intermediate stages of manufacture of a MEMS device 2500 having a pressure sensor and an accelerometer (see FIG. 26). The pressure sensor and accelerometer are manufactured using the same integrated circuit (IC) chip and process. Therefore, various embodiments illustrated by FIGS. 1 through 26 allow for the smooth integration of manufacturing a MEMS pressure sensor device and accelerometer on a single chip.

As shown in FIG. 1, structure 100 includes a substrate 102. Substrate 102 may be formed of silicon, or other materials such as silicon germanium, silicon carbide, a combination thereof, or the like. Substrate 102 may be formed of low resistivity silicon. In some embodiments, substrate 102 may be a silicon-on-insulator (SOI) substrate. An SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

A layer of metallization 104 is formed over substrate 102. Metallization layer 104 may comprise electrical components of the MEMS devices. For example, metallization layer 104 may include one or more sensors for one or more MEMS devices, such as a sensor 104A for an accelerometer and a sensor 104B for a pressure sensor. Metallization layer 104 may also include electrical connections between components of the MEMS devices and to external devices and components.

Metallization layer 104 may be formed using any suitable methods. For example, in some embodiments, the formation of metallization layer 104 includes forming a dielectric layer 106 is formed on substrate 102. In some embodiments, dielectric layer 106 is formed of a polymer, which may be a photo-sensitive material such as polybenzoxazole (PBO), polyimide, benzocyclobutene (BCB), an alloy or combination thereof, or the like, that may be patterned using lithography. In other embodiments, dielectric layer 106 is formed of a nitride such as silicon nitride, an oxide such as silicon oxide, PhosphoSilicate Glass (PSG), BoroSilicate Glass (BSG), Boron-doped PhosphoSilicate Glass (BPSG), an alloy or combination thereof, or the like. Dielectric layer 106 may be formed by spin coating, lamination, chemical vapor deposition (CVD), the like, or a combination thereof. Dielectric layer 106 is then patterned to form openings in which metallization layer 104 will be formed. In embodiments in which dielectric layer 106 is formed of a photo-sensitive material, the patterning may be performed by exposing dielectric layer 106 in accordance with a desired pattern and developed to remove the unwanted material, thereby exposing the desired locations of metallization layer 104. Other methods, such as using a patterned mask and etching, may also be used to pattern dielectric layer 106.

A seed layer (not shown) is formed over dielectric layer 106 and in the openings formed in dielectric layer 106. In some embodiments, the seed layer is a metal layer, which may be a single layer or a composite layer comprising a plurality of sub-layers formed of different materials. In some embodiments, the seed layer is a metal layer, which may be a single layer or a composite layer comprising a plurality of sub-layers formed of different materials. The seed layer may be made of copper, titanium, nickel, gold, an alloy or combination thereof, or the like. In some embodiments, the seed layer comprises a titanium layer and a copper layer over the titanium layer. The seed layer may be formed using, for example, physical vapor deposition (PVD), chemical vapor deposition (CVD), atomic layer deposition (ALD), an alloy or combination thereof, or the like.

A conductive material is then formed on the seed layer and in the openings formed in dielectric layer 106. The conductive material may be formed by plating, such as electroplating or electroless plating, or the like. The conductive material may comprise a metal, like copper, titanium, tungsten, aluminum, an alloy or combination thereof, or the like. Next, excess conductive material overlying the openings in dielectric layer 106 and portions of the seed layer not disposed in an opening of dielectric layer 106 are removed, for example using grinding or chemical mechanical polishing (CMP) or an acceptable etching process, such as by wet or dry etching. The remaining portions of the seed layer and conductive material form the electrical connections of metallization layer 104.

Figure 2:
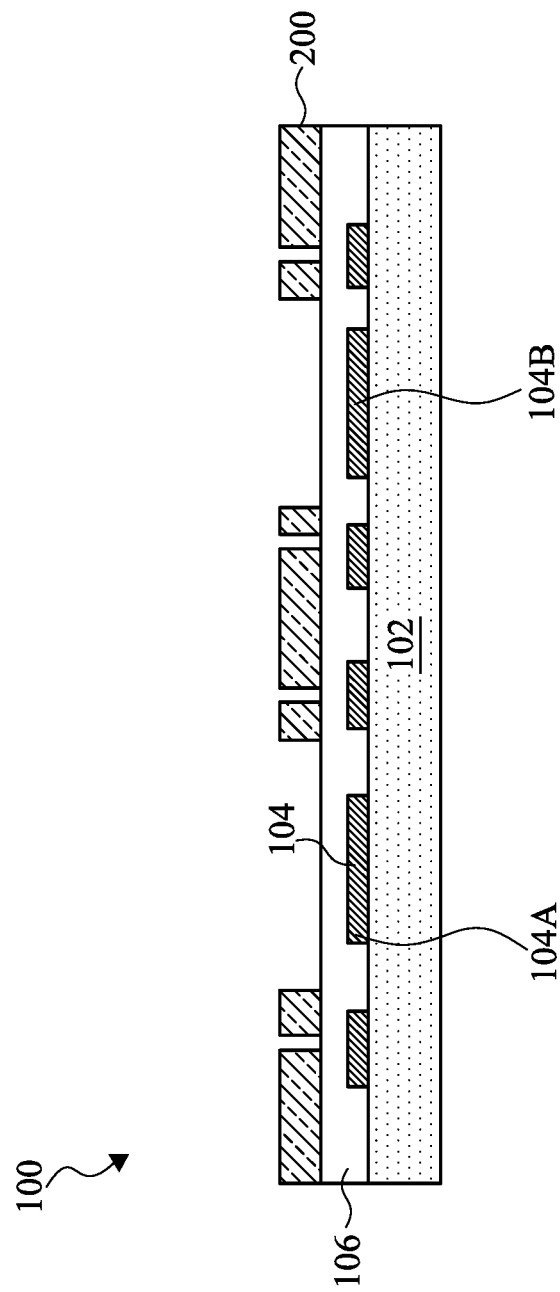

Next, referring to FIG. 2, a photoresist layer 200 is deposited over dielectric layer 106 and patterned. The patterning of photoresist layer 200 exposes the areas of dielectric layer 106 above the metallization layer 104 where the MEMS cavities will be formed. As will be explained in greater detail below, a MEMS accelerometer and a MEMS pressure sensor each comprise a cavity in which a sensor is positioned. Photoresist layer 200 is patterned to expose dielectric layer 106 over and surrounding sensors 104A and 104B where the cavities will be created. Photoresist layer 200 is also patterned to expose the areas of dielectric layer 106 where through vias will be located. As will be discussed in greater detail below, a substrate 800 will be bonded to dielectric layer 106 on an opposite side of dielectric layer 106 from substrate 102 (see FIG. 8). The through vias will provide an electrical connection between metallization layer 104 and contacts on the other side of the substrate 800.

Figure 3:
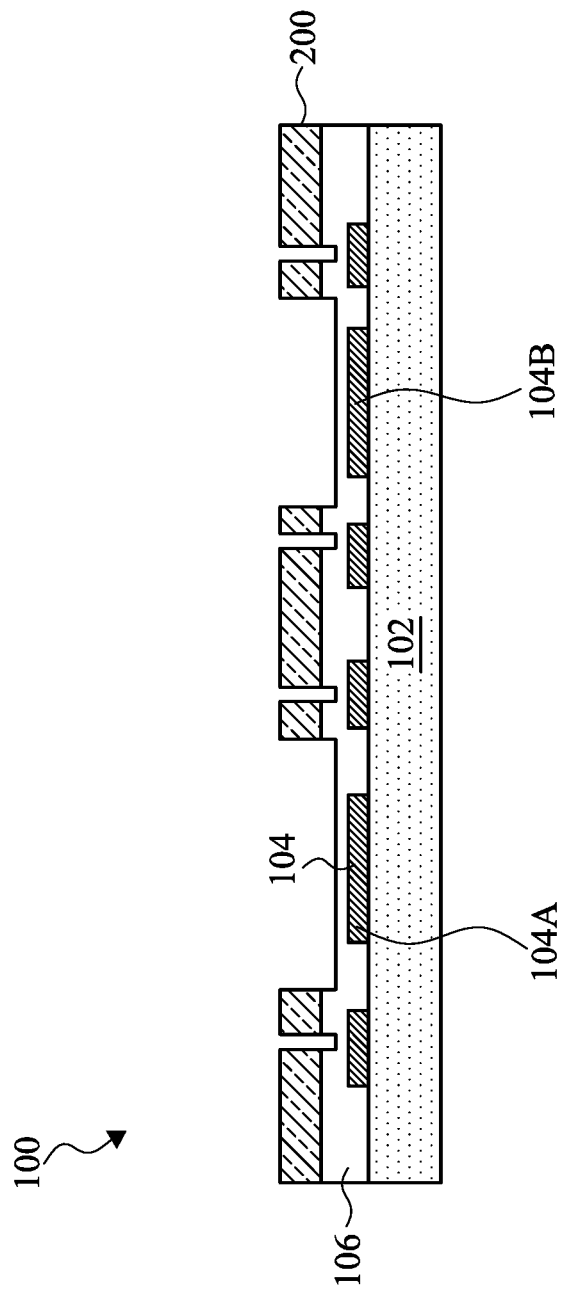
Figure 4:
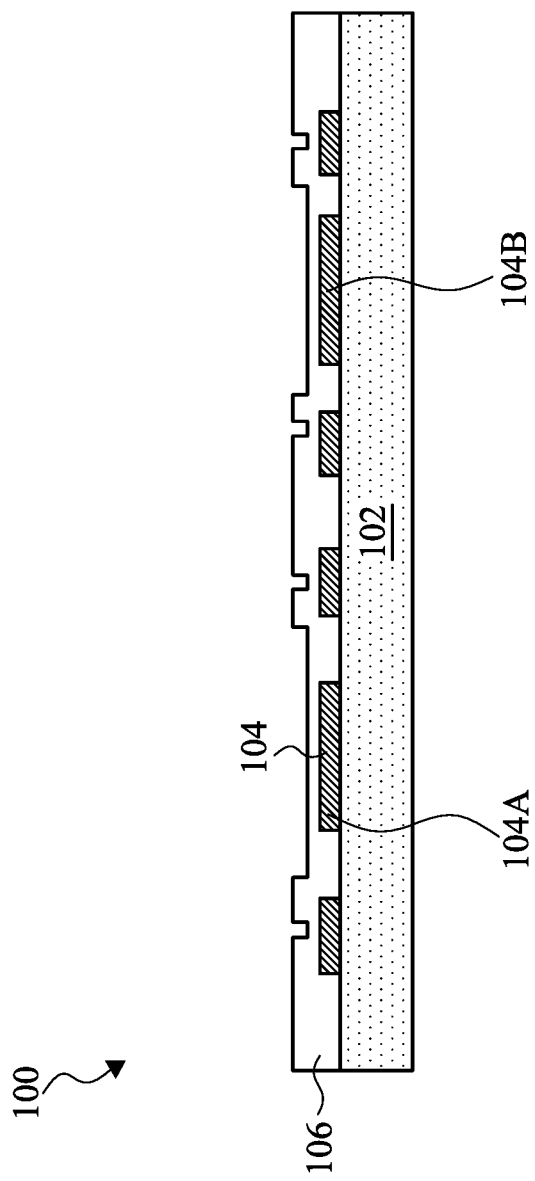

After photoresist layer 200 is patterned, dielectric layer 106 is etched. Any acceptable etching process may be used, such as wet or dry etching. The etched structure is depicted in FIG. 3. As shown in FIG. 3, the etching is a shallow etching and the etching does not penetrate through dielectric layer 106 and does not expose metallization layer 104. Photoresist layer 200 is then removed. Photoresist layer 200 may be removed through a process such as dissolving in chemical solution, plasma ashing or other means, whereby the temperature of photoresist layer 200 is increased until photoresist layer 200 decomposes and may be removed. After photoresist layer 200 is removed, the resulting structure is depicted in FIG. 4.

Figure 5:
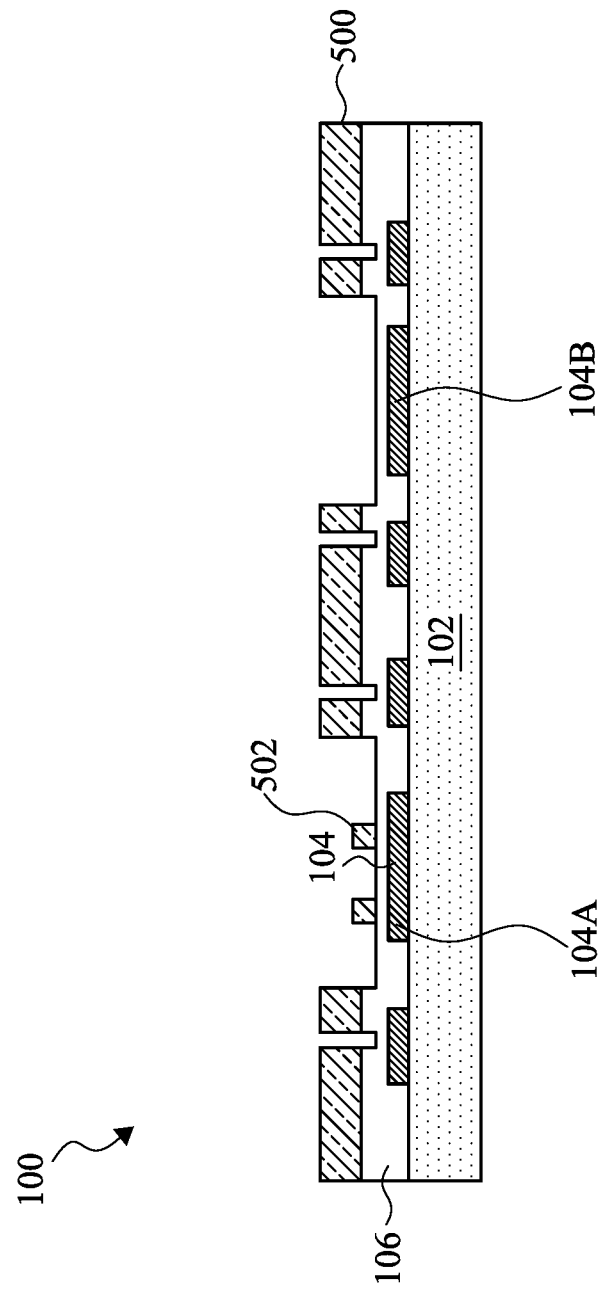

Next, referring to FIG. 5, a photoresist layer 500 is deposited and patterned. As with photoresist layer 200, the patterning of photoresist layer 500 exposes the areas of dielectric layer 106 above metallization layer 104 where the MEMS cavities will be formed. In some embodiments, in may be desirable to retain sections of dielectric layer 106 over metallization layer 104 inside of the planned MEMS cavity. These sections may serve a variety of purposes. For example, in some embodiments these sections may form mechanical bumps that limit the motion of moving elements in a MEMS device. These sections may also be used as anti-stiction bumps. As such, photoresist layer 500 is patterned over the planned MEMS cavity in a manner that retains sections 502 of photoresist layer 500. Section 502 will prevent the underlying areas of dielectric layer 106 from being removed in a subsequent etching step. Photoresist layer 500 is also patterned to expose the areas of dielectric layer 106 where through vias will be located.

Figure 6:
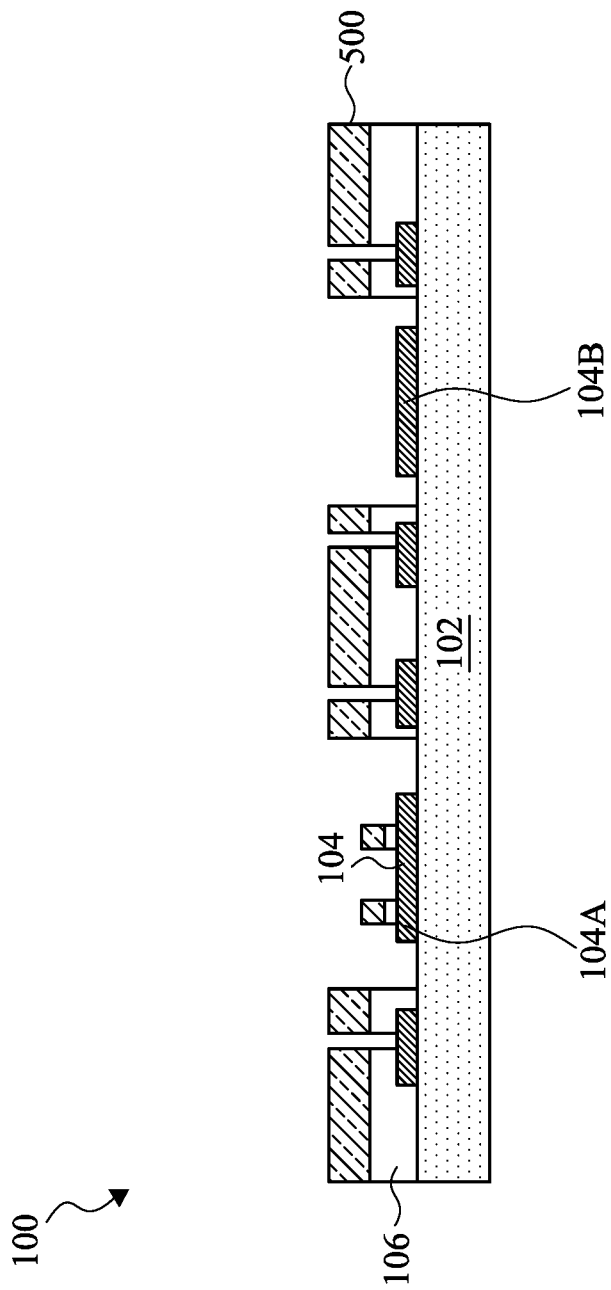
Figure 7:
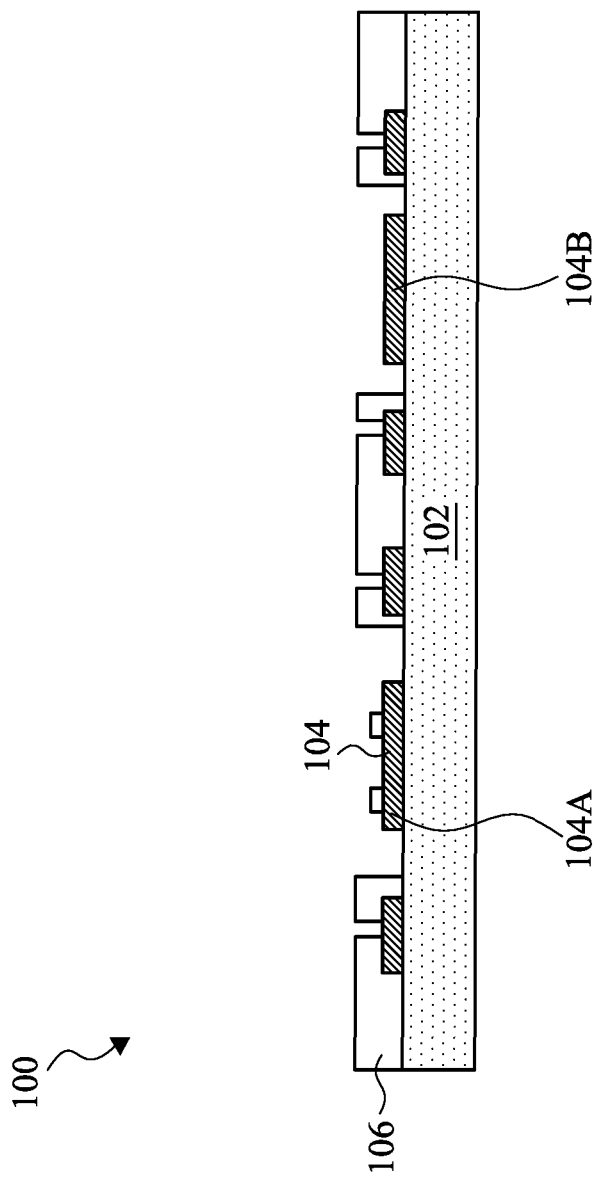

After photoresist layer 500 is patterned, dielectric layer 106 is etched again. Any acceptable etching process may be used, such as wet or dry etching. The etched structure is depicted in FIG. 6. As illustrated in FIG. 6, the etching exposes sections of metallization layer 104, particularly sensors 104A and 104B. The etching also exposes substrate 102 surrounding sensors 104A and 104B and where the through vias will be formed. Photoresist layer 500 is then removed, leaving the structure depicted in FIG. 7. Photoresist layer 500 may be removed through a process such as dissolving in chemical solution, plasma ashing or other means, whereby the temperature of the photoresist layer 500 is increased until photoresist layer 500 decomposes and may be removed.

Figure 8:
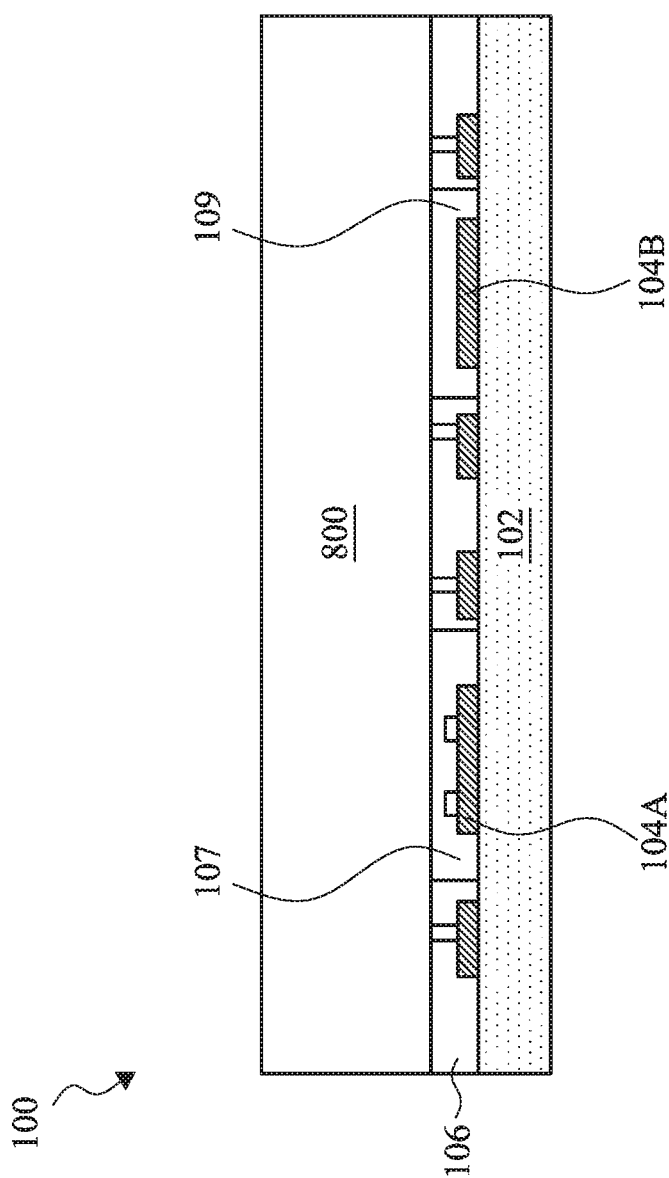

Next, referring to FIG. 8, substrate 800 is bonded to structure 100. Substrate 800 is bonded to a surface of dielectric layer 106 that is opposite to the interface of dielectric layer 105 and substrate 102. Substrate 800 may be formed of silicon, or other materials such as silicon germanium, silicon carbide, an alloy or combination thereof, or the like. Substrate 800 may be formed of low resistivity silicon. In some embodiments, substrate 800 may be a silicon-on-insulator (SOI) substrate. An SOI substrate may comprise a layer of semiconductor material (e.g., silicon, germanium, and the like) formed over an insulator layer (e.g., buried oxide), which is formed in a silicon substrate. In addition, other substrates that may be used include multi-layered substrates, gradient substrates, hybrid orientation substrates, and the like.

Substrate 800 may be bonded to structure 100 using any suitable technique such as fusion bonding, anodic bonding, eutectic bonding, and the like. For example, in various embodiments, substrate 800 may be fusion bonded to structure 100 using a thin polysilicon layer (not shown) as a bonding interface. In some embodiments, the bonding interface may be formed by a deposition process. Once formed, substrate 800 is aligned with structure 100 and the two are contacted together to initiate a bonding of the substrate 800 to structure 100. Once the bonding has been initiated by contacting substrate 800 to structure 100, the bonding process may be strengthened by heating substrate 800 and structure 100 to a temperature. In some embodiments, the temperature may be from 100 degrees to 600 degrees. In some embodiments, a bonding force is applied to substrate 800 and structure 100 to strengthen the bonding process. In some embodiments, a force from 1 KN to 50 KN may be applied.

The bonding of substrate 800 to structure 100 creates cavities in which MEMS devices may be formed. For example, after the bonding, accelerometer sensor 104A is disposed in a cavity 107, and pressure sensor 104B is disposed in a cavity 109.

Figure 9:
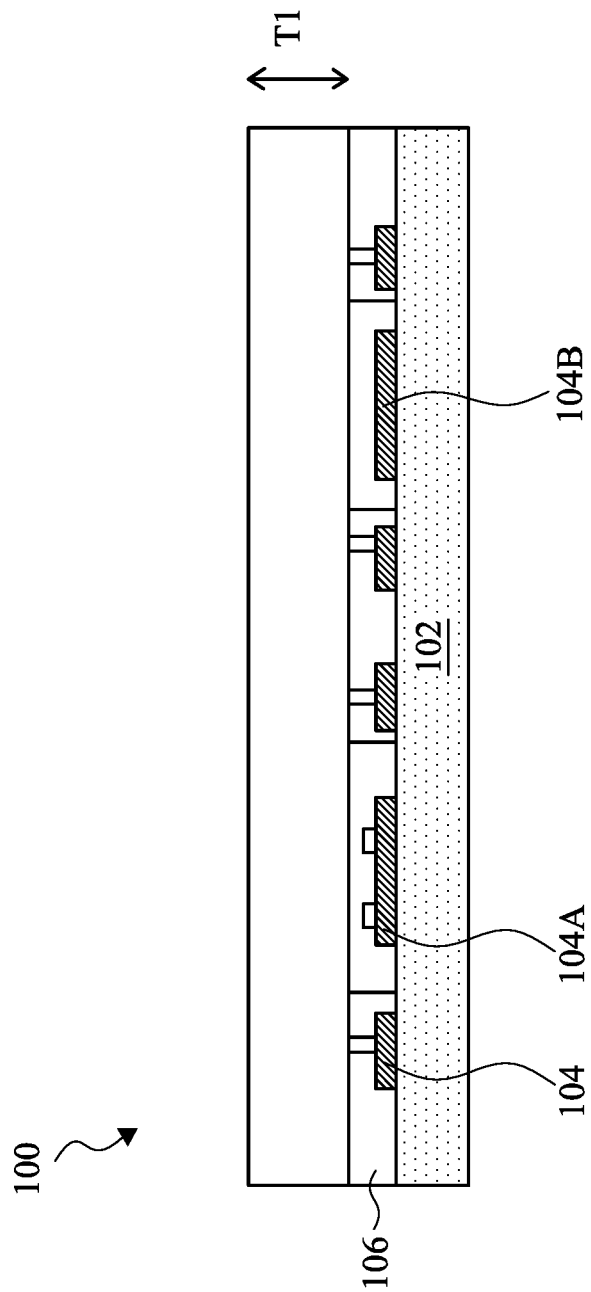

Referring to FIG. 9, substrate 800 may be thinned to a desired thickness T1. The thinning process may include grinding or CMP processes, etch back processes, or other acceptable processes performed on a surface of substrate 800. As a result of this thinning process, substrate 800 may have a thickness T1 from about 10 µm to about 50 µm, such as about 30 µm.

Figure 10:
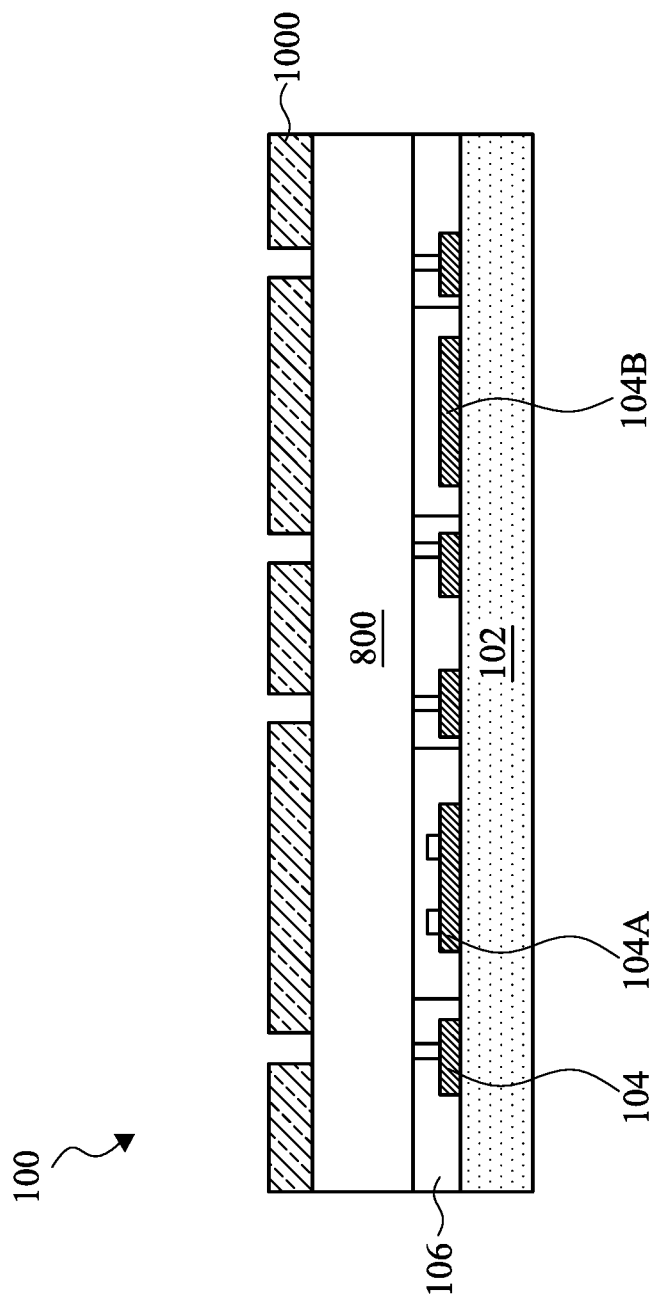

Next, as shown in FIG. 10, photoresist layer 1000 is deposited and patterned. Openings in photoresist layer 1000 expose areas of substrate 800 where through vias will be formed. The through vias provide electrical connections from metallization layer 104 to contacts that will subsequently be formed on a top surface of substrate 800.

Figure 11:
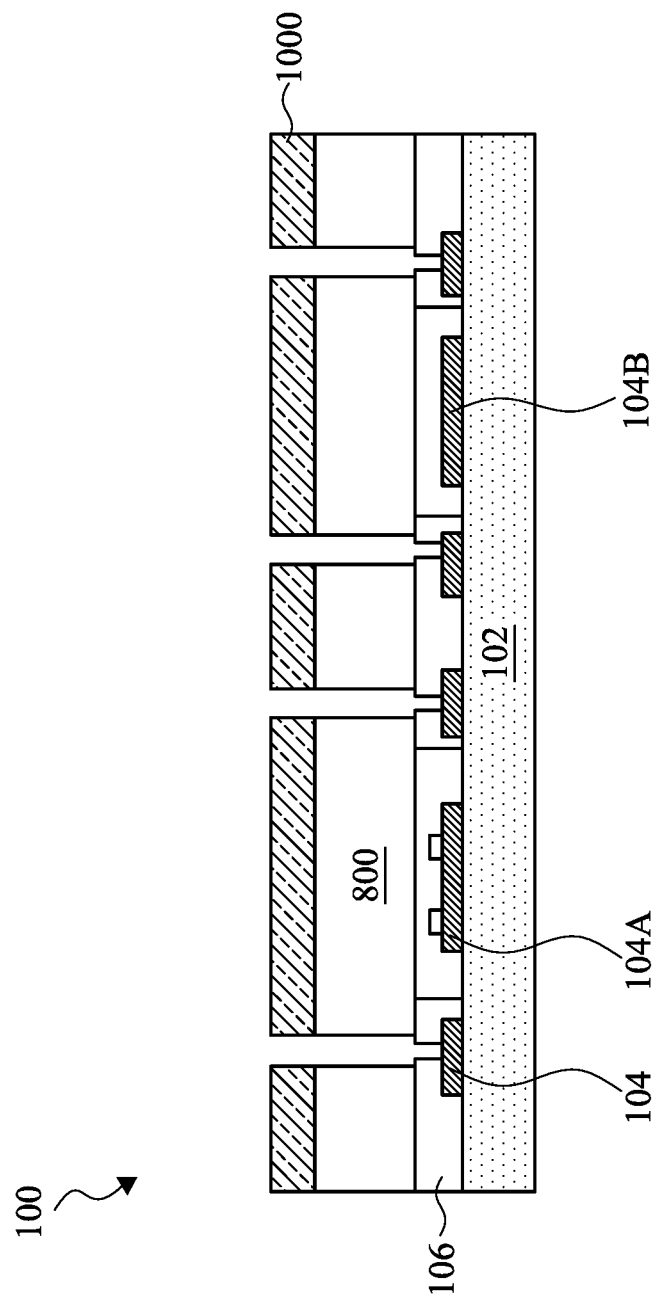

Next, referring to FIG. 11, substrate 800 is etched through the openings in photoresist layer 1000. Any acceptable etching process may be used, such as wet or dry etching. As shown in FIG. 11, the etching creates openings in substrate 800 that penetrate through substrate 800. The openings in substrate 800 are positioned over the through via openings previously created in dielectric layer 106. Photoresist layer 1000 is then removed. Photoresist layer 1000 may be removed through a process such as dissolving in chemical solution, plasma ashing or other means, whereby the temperature of photoresist layer 1000 is increased until photoresist layer 1000 decomposes and may be removed.

Figure 12:
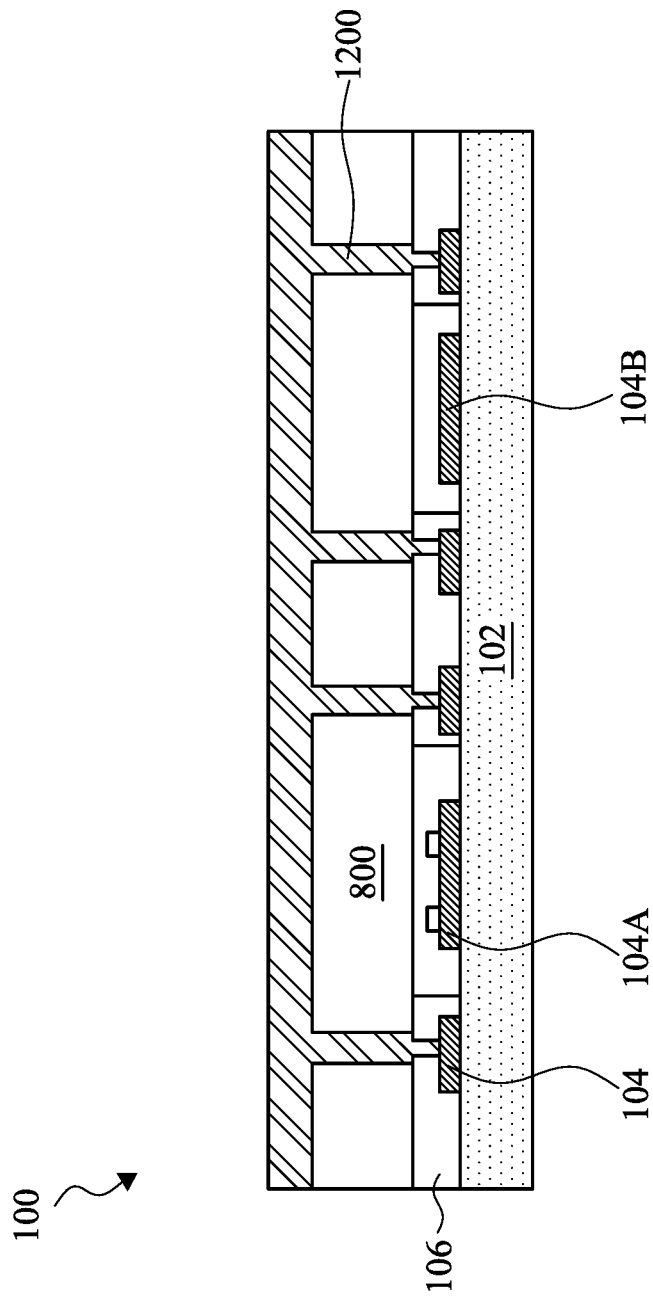

Referring to FIG. 12, through vias 1200 are formed in the openings. Through vias 1200 may be formed, for example, by forming a conductive seed layer (not shown) over the substrate 800. In some embodiments, the seed layer is a metal layer, which may be a single layer or a composite layer comprising a plurality of sub-layers formed of different materials. The seed layer may be made of copper, titanium, nickel, gold, an alloy or combination thereof, or the like. In some embodiments, the seed layer comprises a titanium layer and a copper layer over the titanium layer. The seed layer may be formed using, for example, PVD, CVD, ALD, a combination thereof, or the like.

Next, the openings may be filled with a conductive material using, for example, an electroless plating process or an electrochemical plating process, thereby creating through vias 1200. Through vias 1200 may comprise copper, aluminum, tungsten, nickel, solder, or an alloy or combination thereof. The top-view shapes of through vias 1200 may be rectangles, squares, circles, or the like.

Figure 13:
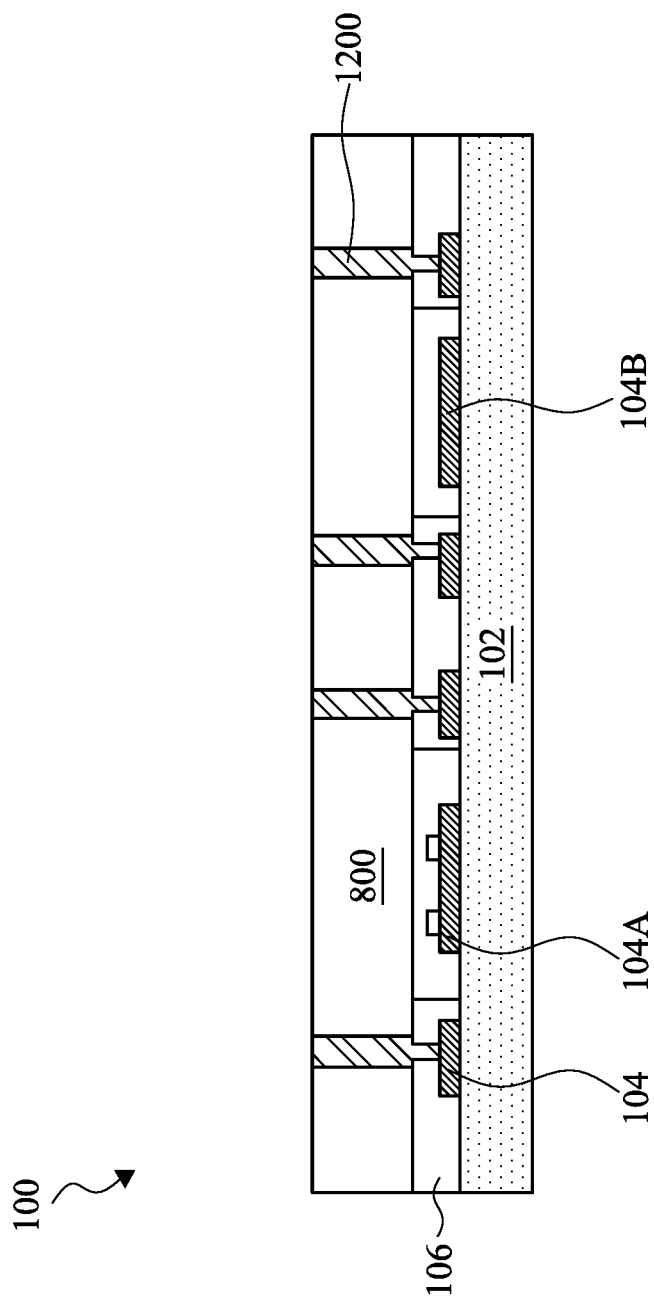

Next, referring to FIG. 13, an etch step or a grinding process, such as a CMP process, may be performed to remove the exposed portions of the seed layer overlying substrate 800 and any excess conductive material overlying through vias 1200. Any suitable etching or grinding process may be used. The resulting structure is depicted in FIG. 13.

In some embodiments, when the seed layer used to form the through vias is formed of a material similar to or the same as through vias 1200, the seed layer may be merged with the through vias 1200 with no distinguishable interface between. In some embodiments, there exist distinguishable interfaces between the seed layer and through vias 1200.

Figure 14:
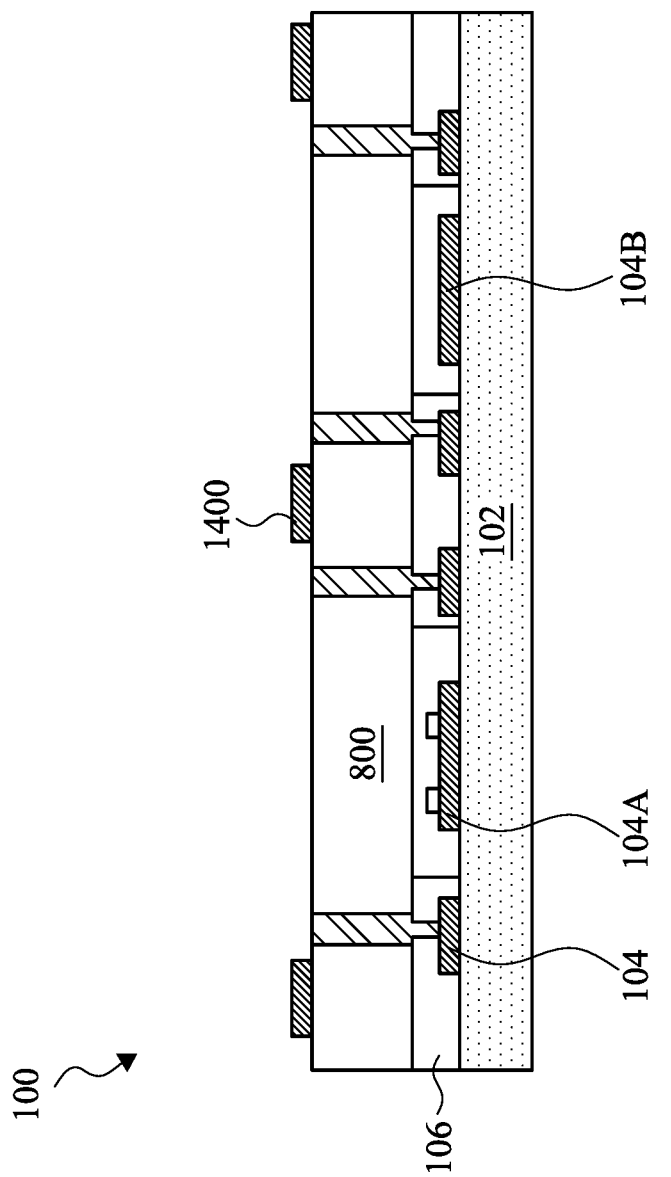

Next, referring to FIG. 14, contacts 1400 are formed over substrate 800. Contacts 1400 may be formed of aluminum copper (AlCu) and are used for eutectic bonding in subsequent process steps. In some embodiments, a different conductive material suitable for eutectic bonding such as Ge, Au, or the like, or a combination or alloy thereof, may be used instead.

Any suitable method of forming contacts 1400 may be used. In some embodiments, a seed layer (not shown) may be deposited over substrate 800. A photoresist layer may be subsequently deposited and patterned, where openings in the photoresist layer expose the desired positions of contacts 1400. The openings may be filled with a conductive material using, for example, an electroless plating process or an electrochemical plating process, thereby creating contacts 1400. The top-view shapes of contacts 1400 may be rectangles, squares, circles, or the like. Next, an etch step or a grinding step such as a CMP process may be performed to remove any excess conductive material overlying contacts 1400. Any suitable etching or grinding process may be used. The photoresist layer may be removed. Another photoresist mask may be deposited and patterned, where openings in the photoresist layer expose the portions of the seed layer that do not underlie a contact 1400. The exposed portions of the seed layer may be etched, and the photoresist layer may be removed, leaving the structure depicted in FIG. 14. Other methods of forming contacts 1400 are possible.

Figure 15:
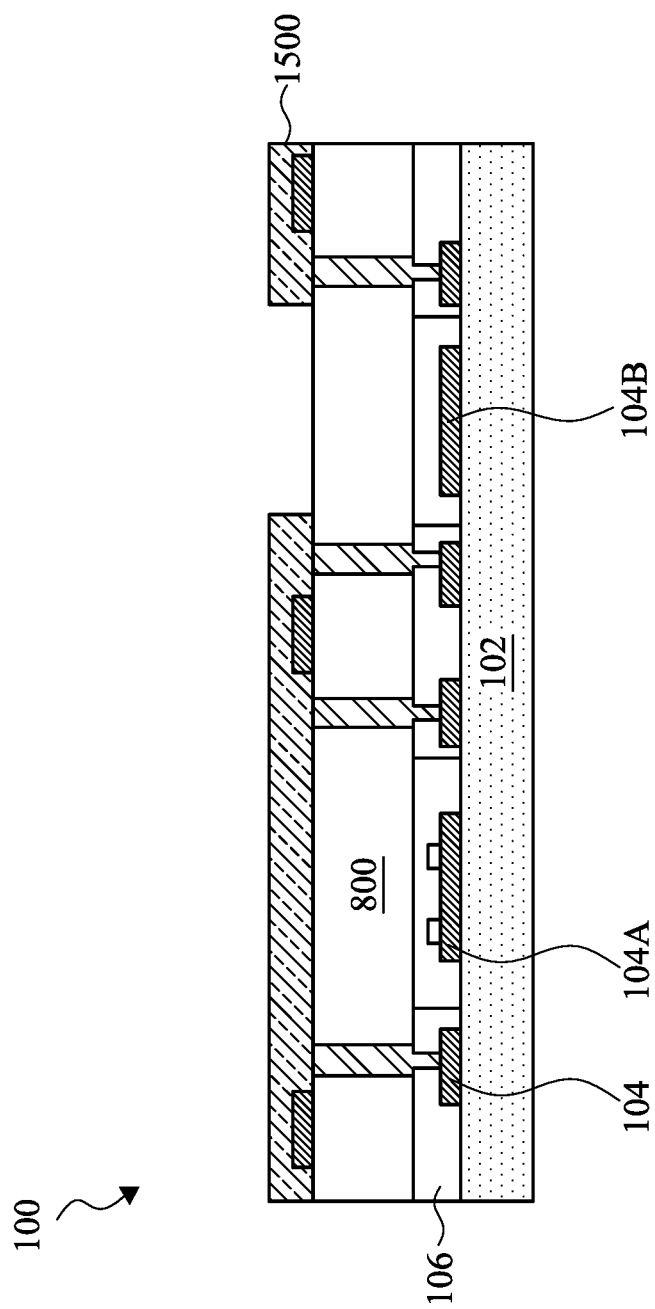
Figure 16:
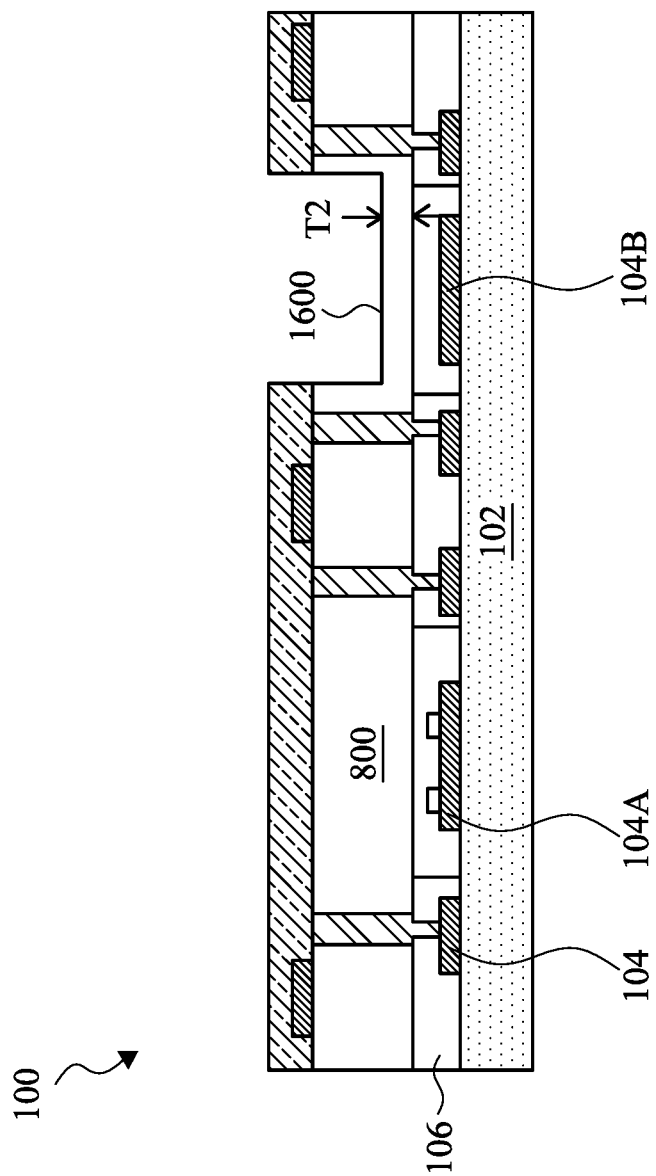

Next, photoresist layer 1500 is deposited over substrate 800 and contacts 1400 and patterned, as shown in FIG. 15. The opening in FIG. 15 exposes a section of substrate 800 over sensor 104B where a pressure sensor membrane will be formed. An etching is then performed on the area of substrate 800 exposed by photoresist layer 1500 using any acceptable etching method. The etched structure is depicted in FIG. 16. As can be seen from FIG. 16, the etching creates membrane 1600, which works in conjunction with sensor 104B as a MEMS pressure sensor. In some embodiments, membrane 1600 may have a thickness T2 between about 0.5 µm to about 10 µm, such as about 5 µm. After the etching, photoresist layer 1500 is removed. Photoresist layer 1500 may be removed through a process such as dissolving in chemical solution, plasma ashing or other means, whereby the temperature of photoresist layer 1500 is increased until photoresist layer 1500 decomposes and may be removed.

Figure 17:
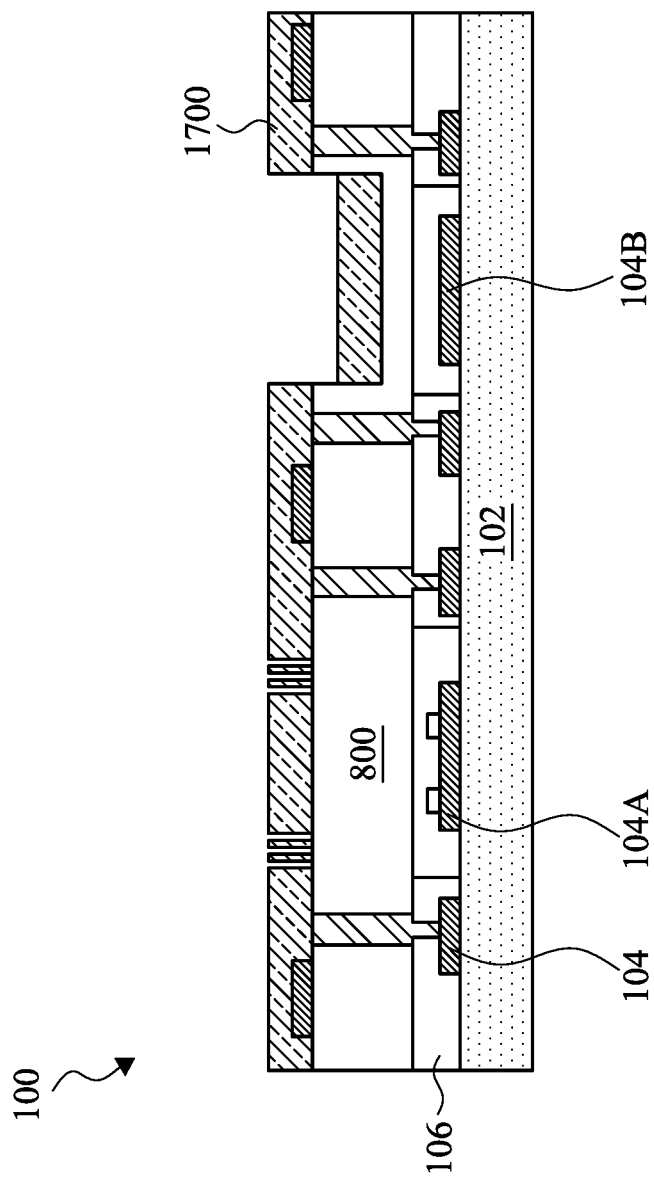
Figure 18:
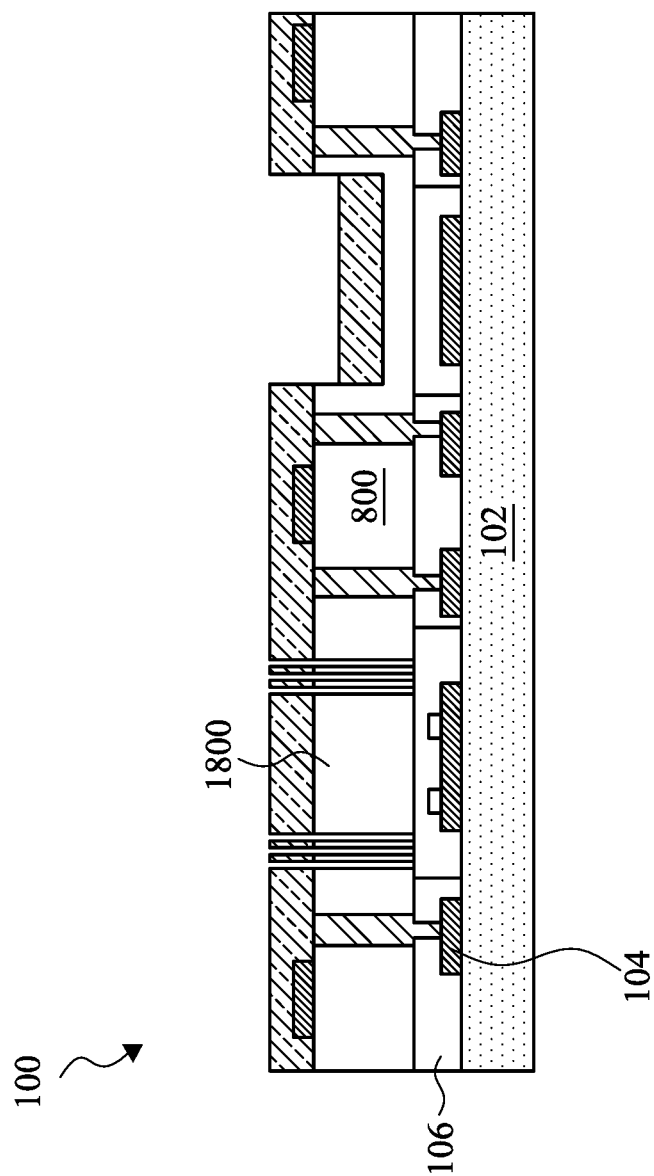

Next, referring to FIG. 17, photoresist layer 1700 is deposited over substrate 800 and patterned. After being patterned, openings in photoresist layer 1700 expose areas of substrate 800 over sensor 104A. Next, an etching is performed on substrate 800 through the openings in layer 1700. Any acceptable etching process may be used, such as wet or dry etching. The etched structure is shown in FIG. 18. The etching creates movable mass 1800. Movable mass 1800 may work in conjunction with sensor 104A to provide a MEMS accelerometer. Movable mass 1800 is attached to other areas substrate 800, for example using springs (not shown) disposed between movable mass 1800 and other areas of substrate 800. The springs attach movable mass 1800 to the overall structure while still allowing movable mass 1800 to move.

Figure 19:
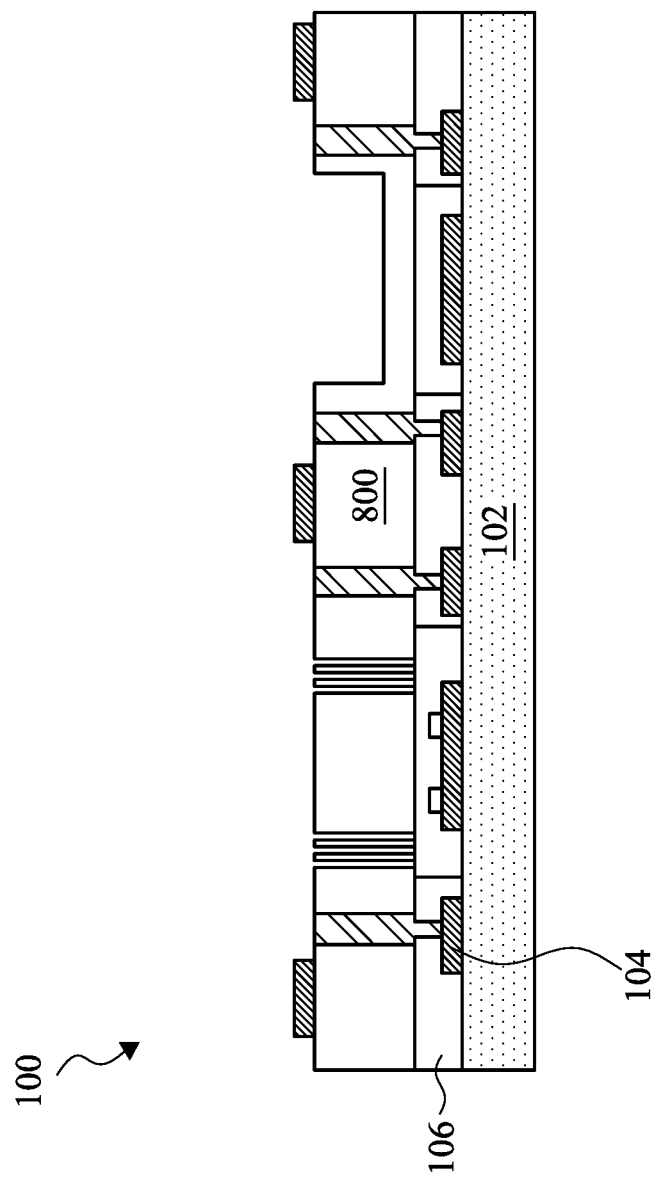
Figure 20:
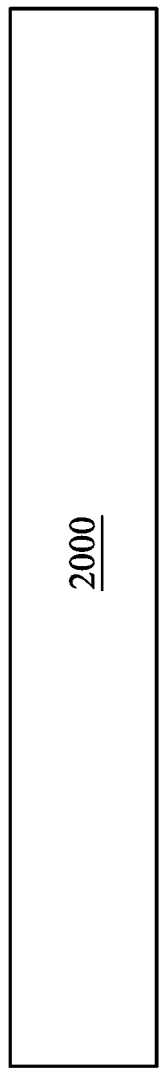

Next, photoresist layer 1700 is removed. Photoresist layer 1700 may be removed through a process such as dissolving in chemical solution, plasma ashing or other means, whereby the temperature of photoresist layer 1700 is increased until photoresist layer 1700 decomposes and may be removed. The resulting structure is depicted in FIG. 19.

Next, a cap wafer will be bonded to the structure 100. FIGS. 20 through 24 illustrate various intermediary steps of manufacture of a cap wafer 2000 for inclusion in the completed MEMS device 2500. Cap wafer 2000, depicted in FIG. 20, may or may not be a semiconductor wafer (e.g., a CMOS wafer), which may or may not have electrical circuits (not shown). In particular cap wafer 2000 may include various active devices such as transistors, capacitors, resistors, diodes, photodiodes, fuses and the like. The electrical circuits may be interconnected to perform one or more functions suitable for a particular application, which may or may not be related to MEMS device 2500.

Figure 21:
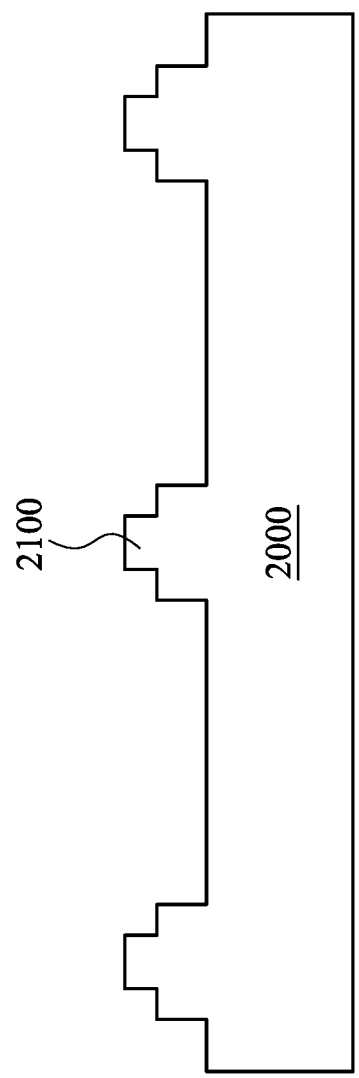

Referring to FIG. 21, cap wafer 2000 is patterned to create a plurality of bonding regions 2100. Bonding regions 2100 are regions where cap wafer 2000 will be bonded to structure 100. Bonding regions 2100 may be created in cap wafer 2000 using any suitable etching techniques, including those described above. For example, a photoresist layer may be deposited over cap wafer 2000 and patterned, where openings in the photoresist layer expose regions of cap wafer 2000 to be etched. An etching may be performed using any suitable etching process, such as wet or dry etching. The photoresist layer may be removed, for example through a process such as dissolving in chemical solution, plasma ashing or other means, whereby the temperature of the photoresist is increased until the photoresist decomposes and may be removed.

These steps may be repeated as necessary to achieve the desired shape of cap wafer 2000, as determined according to the particular package design.

Figure 22:
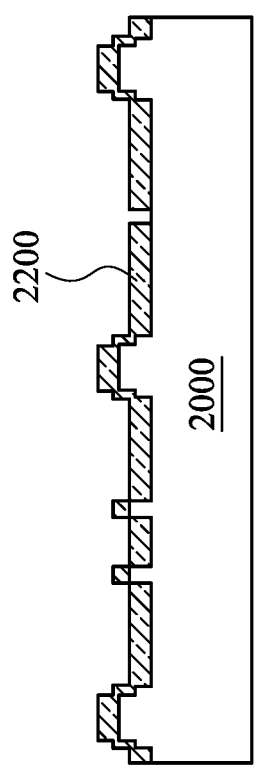

Next, referring to FIG. 22, a photoresist layer 2200 is deposited over cap wafer 2000. Photoresist layer 2200 is patterned to create an opening exposing a section of cap wafer 2000 in which a hole will be created. As will be explained below, after cap wafer 2000 is bonded to structure 100, a cavity will be created between cap wafer 2000 and pressure sensor membrane 1600. A subsequent thinning of cap wafer 2000 will expose the inner cavity to ambient pressure through the hole in cap wafer 2000 (see FIG. 26).

Figure 23:
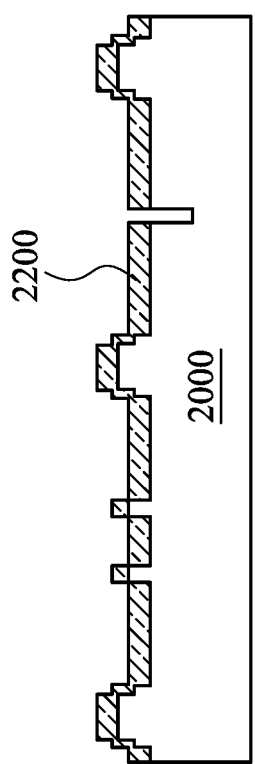

Referring to FIG. 23, a hole is etched in cap wafer 2000 through the opening in photoresist layer 2200. Any acceptable etching process may be used, such as a dry etching or a wet etching. The hole created by the etching does not penetrate through cap wafer 2000, and the hole terminates within cap wafer 2000.

After the hole is etched into cap wafer 2000, photoresist layer 2200 is removed. Photoresist layer 2200 may be removed through a process such as dissolving in chemical solution, plasma ashing or other means, whereby the temperature of photoresist layer 2200 is increased until photoresist layer 2200 decomposes and may be removed.

Figure 24:
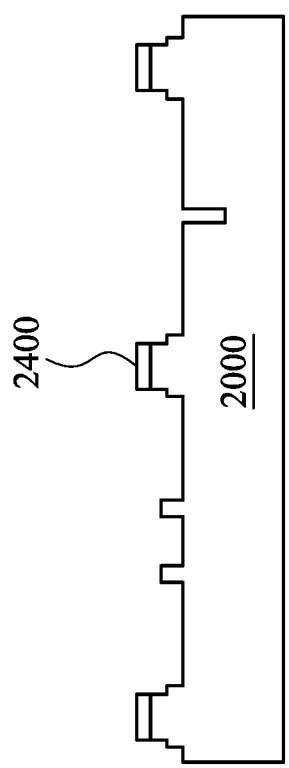

Next, referring to FIG. 24, bonding material layer 2400 (alternatively referred to as bonds 2400) are formed over a top surface of cap wafer 2000. Bonding material layers 2400 may be blanket deposited and patterned using for example PVD and photolithography/etching. Bonding material layers 2400 may be made of a layer of AlCu under a layer of germanium although other metallic materials such as gold may also be used. Bonding material layers 2400 may act as a eutectic bonding material for a subsequent bonding process. Bonding material layers 2400 may or may not be electrically connected to conductive lines within cap layer 2000.

FIG. 25 illustrates stacked MEMS device 2500, wherein cap wafer 2000 is flipped and stacked over structure 100. Cap wafer 2000 may be bonded to structure 100 by eutectic bonding between bonding material layers 2400 and contacts 1400. As shown in FIG. 25, through the eutectic bonding process, moveable elements (e.g., movable mass 1800) may be located between accelerometer sensor 104A and cap wafer 2000. Furthermore, cap wafer 2000 and structure 100 are aligned so that sensor 104A is disposed in a sealed cavity defined by the eutectic bonding.

In FIG. 26, a grinding process is performed to remove portions of cap wafer 2000. The grinding may also be referred to as an open pad grinding (OPG) exposing portions of cap wafer 2000 and may be done using known grinding techniques. The removal of portions of cap wafer 2000 may include known removal techniques such as CMP, etch-back, a combination thereof, or the like.

In some embodiments, the OPG of cap wafer 2000 may expose portions of metal lines (not shown) within cap wafer 2000. These exposed portions of metal lines may be used as input/output pads to electrically couple circuits in cap wafer 2000 to external circuits (not shown). Further, the grinding may expose cavity 2600 to ambient pressure. That is, cavity 2600 is exposed to an open air environment.

FIG. 26 illustrates a completed MEMS device 2500 in accordance with various embodiments. MEMS device 2500 includes a pressure sensor 2602. Pressure sensor 2602 includes a membrane (i.e., region 1600 of substrate 800) and a sensor 104B. Membrane 1600 is exposed to ambient pressure on one surface (e.g., through cavity 2600) and sealed pressure on the other surface (e.g., through sealed cavity 2606). Cavity 2600 is partially bounded by membrane 1600. The pressure of sealed cavity 2606 may be defined by the conditions of the fusion bonding process between dielectric layer 106 and substrate 800. For example, the fusion bonding process may be performed in chamber having a certain pressure level to define an appropriate pressure level of the sealed cavities. For example, sealed cavity 2606 may have a pressure from about 1 mbar to about 300 mbar, such as 10 mbar. Therefore, pressure sensor 2602 may detect ambient pressure by comparing the difference between cavity 2600 and sealed cavity 2606.

MEMS device 2500 also contains an accelerometer that detects acceleration through the disposition of movable mass 1800 over accelerometer sensor 104A in sealed cavity 2608 having pressure defined by eutectic bonding. For example, movable mass 1800 may move in relation to the overall motion of the accelerometer, thereby causing the capacitance of the sensor 104A to change and allowing a processor (not shown in FIG. 26) to determine the acceleration from the movement of the movable mass 1800. The pressure of sealed cavity 2608 may be selected in accordance with the desired functionality of accelerometer 2604. The pressure of sealed cavity 2608 may be defined by the conditions of the bonding process between bonding material layers 2400 and contacts 1400. For example, the eutectic bonding process may be performed in chamber having a certain pressure level to define an appropriate pressure level of the sealed cavities. For example, sealed cavity 2608 may have a pressure from about 1 mbar to about 1100 mbar, such as 700 mbar.

Thus, using the various formation steps illustrated in FIGS. 1 through 26, a pressure sensor and an accelerometer may be formed on a single chip and using the same MEMS manufacturing process with minimal additional cost. The processes and devices described herein may provide for integrated MEMS devices with smaller sizes. The processes and devices described herein may also provide for integrated MEMS devices produced with reduced cost.

According to certain embodiments, a method for forming a micro-electromechanical (MEMS) device is provided. The method includes patterning a dielectric layer of a first substrate to expose conductive features and a bottom layer through the dielectric layer. The first substrate includes the dielectric layer and the bottom layer. The conductive features are disposed in the dielectric layer proximate to the bottom layer. A first surface of a second substrate is bonded to the dielectric layer. The second substrate is patterned to form a membrane and a movable element. A first plurality of metal bonds is formed on a second surface of the second substrate, where the second surface is opposite the first surface. A second plurality of metal bonds is formed on a surface of a cap wafer. A cap wafer is bonded to the second substrate by bonding the second plurality of metal bonds to the first plurality of metal bonds. Bonding the cap wafer to the second substrate forms a first sealed cavity comprising the movable element and a second sealed cavity that is partially bounded by the membrane. Portions of the cap wafer are removed to expose the second sealed cavity to ambient pressure.

According to certain embodiments, a method for forming a micro-electromechanical (MEMS) device is provided. The method includes patterning a dielectric layer of a first substrate to create a first cavity and a second cavity. The first substrate includes the dielectric layer and a bottom layer. A first electrode is disposed on the bottom layer in the first cavity and a second electrode disposed on the bottom layer in the second cavity. The dielectric layer is patterned to expose a plurality of conductors, the conductors disposed in the dielectric layer on the bottom layer. A first surface of a second substrate is bonded to the dielectric layer, the bonding sealing the second cavity. A plurality of through vias are formed that extend from the conductors through the second substrate. The second substrate is patterned to create a movable feature, the movable feature positioned over the first electrode. The second substrate is patterned to create a membrane, the membrane positioned over the second electrode. An opening is formed in a third substrate. The third substrate is bonded to the second substrate in a manner that the opening in the third substrate is positioned over the membrane, where bonding the third substrate to the second substrate forms a third sealed cavity and a fourth sealed cavity. The third sealed cavity comprises the movable feature and the first cavity. The fourth cavity is partially bounded by the membrane. Portions of the third substrate are removed to expose the fourth sealed cavity to ambient pressure through the opening in the third substrate.

According to certain embodiments, a micro-electromechanical (MEMS) device is provided. The device includes a first substrate. The first substrate includes a bottom layer, a dielectric layer overlying the bottom layer, and an upper layer overlying the dielectric layer. A first cavity is disposed in the dielectric layer. The first cavity is partially bounded by the bottom layer and partially bounded by a membrane formed from the upper layer. A first conductive feature is disposed in the first cavity and the first cavity has a first pressure. A second conductive feature is disposed in a second cavity. A movable element is positioned over the second conductive feature. The second cavity has a second pressure. A cap wafer is bonded to the first substrate. The cap wafer and the first substrate define a third cavity having an ambient pressure. The third cavity is partially bounded by the membrane. The second cavity extends through the upper layer of the first substrate to the cavity wafer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a micro-electromechanical systems (MEMS) device, the method comprising:
   patterning a dielectric layer of a first substrate to expose conductive features and a bottom layer through the dielectric layer, the first substrate comprising the dielectric layer and the bottom layer, the conductive features being disposed in the dielectric layer on the bottom layer;
   bonding a first surface of a second substrate to the dielectric layer;
   patterning the second substrate to form a membrane and a movable element;
   forming a first through via adjacent to the movable element;
   forming a first plurality of metal bonds on a second surface of the second substrate, wherein the second surface is opposite the first surface, wherein the first plurality of metal bonds includes a first metal bond that is closest to the movable element, wherein the first through via is disposed between the movable element and a portion of second substrate on which the first metal bond is formed, and wherein the second substrate is continuous between the first through via and the portion of the second substrate on which the first metal bond is formed;
   forming a second plurality of metal bonds on a surface of a cap wafer;
   bonding the cap wafer to the second substrate by bonding the second plurality of metal bonds to the first plurality of metal bonds, wherein bonding the cap wafer to the second substrate forms a first sealed cavity and a second sealed cavity, the first sealed cavity comprising the movable element, and the second sealed cavity being partially bounded by the membrane; and
   removing portions of the cap wafer to expose the second sealed cavity to ambient pressure.

2. The method of claim 1, wherein bonding the cap wafer to the second substrate comprises a eutectic bonding process, wherein a pressure level of the first cavity after the bonding is defined by the eutectic bonding process.

3. The method of claim 1, wherein bonding the second substrate to the first substrate comprises a fusion bonding process.

4. The method of claim 1, wherein the first through via extends from at least one of the conductive features in the dielectric layer through the second substrate.

5. The method of claim 1 claim, further comprising forming a plurality of anti-stiction bumps that are positioned underneath the movable element.

6. The method of claim 1, wherein removing portions of the cap wafer to expose the second sealed cavity to ambient pressure comprises forming an opening in the cap wafer to expose the second cavity to an ambient environment.

7. The method of claim 1, wherein the bonding of the first surface of the second substrate to the dielectric layer creates a third sealed cavity, wherein a pressure level of the third cavity after the bonding is defined by the bonding process.

8. A method for forming a micro-electromechanical systems (MEMS) device comprising:
   patterning a dielectric layer of a first substrate to create a first cavity and a second cavity, the first substrate comprising the dielectric layer and a bottom layer, a first electrode disposed on the bottom layer in the first cavity and a second electrode disposed on the bottom layer in the second cavity;
   patterning the dielectric layer to expose a plurality of conductors, the conductors disposed in the dielectric layer on the bottom layer;
   bonding a first surface of a second substrate to the dielectric layer, the bonding sealing the second cavity;
   forming a plurality of through vias that extend from the conductors through the second substrate;
   patterning the second substrate to create a movable feature, the movable feature positioned over the first electrode;
   patterning the second substrate to create a membrane, the membrane positioned over the second electrode, wherein a first through via of the plurality of through vias and a second through via of the plurality of through vias are disposed adjacent to the membrane and on opposite sides of the membrane, a third through via of the plurality of through vias is disposed between the second through via and the movable feature, and wherein a portion of the second substrate that is between the second through via and the third through via is continuous along a line that extends from the second substrate to the third through via;
   forming an opening in a third substrate;

bonding the third substrate to the second substrate in a manner that the opening in the third substrate is positioned over the membrane, wherein bonding the third substrate to the second substrate forms a third sealed cavity and a fourth sealed cavity, the third sealed cavity comprising the movable feature and the first cavity, and the fourth cavity being partially bounded by the membrane; and removing portions of the third substrate to expose the fourth sealed cavity to ambient pressure through the opening in the third substrate.

9. The method of claim 8, wherein a pressure level of the third sealed cavity is defined by a bonding process between the third substrate and the second substrate.

10. The method of claim 8, wherein bonding the first surface of the second substrate to the dielectric layer comprises fusion bonding.

11. The method of claim 8, further comprising forming a plurality of anti-stiction bumps over the first electrode.

12. The method of claim 8, wherein bonding the third substrate to the second substrate comprises a eutectic bonding process between a first plurality of bonds disposed on the second substrate and a second plurality of bonds disposed on the third substrate.

13. A method for forming a micro-electromechanical systems (MEMS) device comprising:
    bonding a first substrate to a second substrate, the bonding of the first substrate to the second substrate creating a first sealed cavity and a second sealed cavity, wherein a first conductive feature is exposed in the first sealed cavity and a second conductive feature is exposed in the second sealed cavity;
    forming a plurality of bonds on a first surface of the second substrate;
    depositing and patterning a first mask layer, the first mask layer being patterned to expose a section of the second substrate;
    etching the second substrate through the patterned first mask layer to form a membrane overlying the first conductive feature, wherein the membrane is directly physically connected to a portion of the second substrate on which a closest bond of the plurality of bonds is formed;
    depositing and patterning a second mask layer, the second mask layer being patterned to expose a plurality of sections of the second substrate;
    etching the second substrate to form a movable element overlying the second conductive feature, wherein the etching of the second substrate unseals the second sealed cavity;
    bonding a cap layer to the second substrate using the plurality of bonds to form a third sealed cavity and a fourth sealed cavity, the third sealed cavity comprising the movable element, the fourth cavity being defined in part by the membrane; and
    thinning the cap layer to expose an opening in the cap layer, wherein exposing the opening in the cap layer unseals the fourth sealed cavity and exposes the membrane to ambient pressure.

14. The method according to claim 13, further comprising thinning the second substrate after bonding the second substrate to the first substrate.

15. The method according to claim 13, further comprising:
    depositing and patterning a third mask layer over the second substrate, the third mask layer being patterned to expose portions of the second substrate;
    etching the second substrate and the first substrate through the patterned third mask layer to create a plurality of openings, a conductive feature of the first substrate being exposed by each of the plurality of openings; and
    performing a plating process to form a plurality of through vias in each of the plurality of openings.

16. The method according to claim 13, wherein the membrane and the movable element are formed in separate etching processes.

17. The method according to claim 13, further comprising forming a plurality of anti-stiction bumps in the cap layer.

18. The method according to claim 13, wherein the third sealed cavity has a pressure that is higher than ambient pressure.

19. The method according to claim 13, further comprising forming a plurality of anti-stiction bumps between the second conductive feature and the movable element.

20. The method according to claim 13, wherein a surface of the membrane that is farthest from the first substrate is recessed from the first surface of the second substrate.

* * * * *